United States Patent

Pesklak et al.

Patent Number: 5,891,242
Date of Patent: Apr. 6, 1999

[54] APPARATUS AND METHOD FOR DETERMINING AN EPITAXIAL LAYER THICKNESS AND TRANSITION WIDTH

[75] Inventors: William Charles Pesklak; Bruce Laurence Colburn, both of Vancouver, Wash.

[73] Assignee: Seh America, Inc., Vancouver, Wash.

[21] Appl. No.: 874,394

[22] Filed: Jun. 13, 1997

[51] Int. Cl.$^6$ .................................................. C30B 29/06
[52] U.S. Cl. ................................ 117/84; 117/85; 117/88; 117/2; 117/96; 117/928; 117/835; 148/33; 148/331
[58] Field of Search .................................. 117/84, 85, 88, 117/928, 935, 2, 96; 148/33, 33.1

[56] References Cited

U.S. PATENT DOCUMENTS

| | | | |
|---|---|---|---|
| 3,155,621 | 11/1964 | Etal | 117/935 |
| 3,488,712 | 1/1970 | Seiter | 117/88 |
| 5,414,259 | 5/1995 | Kingston | 250/283 |
| 5,604,581 | 2/1997 | Liu | 356/73 |

*Primary Examiner*—Robert Kunemund
*Attorney, Agent, or Firm*—Alston & Bird LLP

[57] ABSTRACT

An apparatus for and a method of determining the epitaxial layer thickness and transition width in epitaxial single crystal silicon wafers are provided. The apparatus provides an epitaxial single crystal silicon wafer comprising an isotopically enriched doped substrate. The method involves a process of applying Second Ion Mass Spectrometry (SIMS) to the isotopically enriched doped wafer for determining its epitaxial layer thickness and transition width.

16 Claims, 1 Drawing Sheet

APPARATUS AND METHOD FOR DETERMINING AN EPITAXIAL LAYER THICKNESS AND TRANSITION WIDTH

BACKGROUND OF THE INVENTION

1. Area of the Art

The invention relates generally to silicon wafer manufacture, and more specifically to apparatus and methods for determining an epitaxial layer thickness and transition width.

2. Description of the Prior Art

Common and presently used epitaxial wafers in the micro-electronic industry often comprise highly doped substrates (low specific resistivity) and lower doped epitaxial layers (high specific resistivity.) Typical specifications of P/P+ and N/N+ wafers demand a well-defined layer thickness of the epitaxial layer, yet demand a certain transition width at the layer-substrate interface. The transition width is the depth at which measurable auto-doping occurs from the higher doped substance into the lower doped epitaxial layer.

Epitaxial wafers, such as P/P+ and N/N+ types used in the micro-electronic industry, display a significant difference in the doping concentration of the silicon substrate and the epitaxial layer. Such layers can be easily measured utilizing techniques designed to determine changes in doping concentrations or the conductivity type of the dopant as is in the case of P/N junctions.

Newer tendencies for present and future device applications, such as large wafer diameter processes for extremely high integration that is used for 64 Mb and 1 GB DRAM (Dynamic Random Access Memory) technologies, call for different specifications, however. Such epitaxial structures will require similar specific resistivities for substrates and layers, and are often referred to as P−/P− or N−/N− depending on the conductivity type. Future applications for state-of-the-art device manufacturing will most probably employ P−/P− or N−/N− epitaxial wafers. Consequently, such applications require the determination of epitaxial layer and substrate interactions.

Conventional measurements, utilizing methods sensitive to doping concentration changes to determine the epitaxial layer thickness or associated transition width, cannot be applied to the determination of the above discussed epitaxial layer and substrate interactions. Examples of typical and commonly used techniques to determine properties of epitaxial layers are the spreading resistance (SRP) method, the capacitance-voltage (C-V) method, the junction staining method and the Fourier Transform Infrared Spectrometry (FTIR) method. All these methods are designed to determine or correspond to changes in doping concentrations or the conductivity type of the dopant. They are not suitable to accurately determine epitaxial layer and substrate interactions if the changes in doping concentrations or the conductivity type are small.

Therefore, a need exists to develop a method which can be used to determine epitaxial layer thickness and transition width of a silicon wafer having similar specific resistivities for substrates and epitaxial layers.

SUMMARY OF THE INVENTION

It is an object of the present invention to provide a method for determining the epitaxial layer thickness and transition width of a silicon wafer, and particularly for making the determination possible when the silicon wafer has similar specific resistivities for substrates and epitaxial layers.

These and other objects and advantages are achieved in a single crystal silicon wafer comprising an isotopically enriched doped substrate and an epitaxial layer deposited on the substrate, whereby the epitaxial layer thickness and transition width can be determined by Secondary Ion Mass Spectrometry (SIMS). The objects and advantages are also achieved by using a novel method for measuring dopant distributions in a silicon wafer. In a preferred embodiment, the method comprises the steps of providing a single crystal silicon wafer having an isotopically enriched doped substrate and performing a dopant isotope ratio analysis.

Such an arrangement has been found to provide a number of advantages. As explained in greater detail below, it has been found that the apparatuses and methods of the present invention can be used to determine the epitaxial layer thickness and transition width of a silicon wafer having similar resistivities for the substrate and the epitaxial layers. The present invention is independent of the doping level of the wafers since the measured parameter is a ratio of the atomic isotopes, not the differences in the substrate versus epitaxial doping densities. Therefore, the present invention is particularly useful for epitaxial single crystal silicon wafers where the dopant concentration of the substrate is similar to, or not significantly different from, the dopant concentration of the epitaxial layer.

In addition, the present invention is able to provide depth profiles of the isotopic ratio with adequate depth resolution and ratio precision to enable calculation of the transition width, even on very thin epitaxial layers where the conventional capacitance-voltage (C-V) method may be inapplicable. In particular, the C-V measurement method is limited to a minimum depth of about 1 $\mu$m in material having a resistivity of around 10 $\Omega$cm, respectively to 0.2 $\mu$m in material with the resistivity of about 1 $\Omega$cm. The depth resolution of the SIMS method is expected to be better than 0.2 $\mu$m which makes it a better candidate for shallow analysis.

Furthermore, the present invention enables rapid analysis since SIMS instruments available can hold a whole wafer and save the step of sample preparation. More importantly, further processing of the sample is possible, since the SIMS probed area is microscopically small and could be placed away from active device regions. The method further saves expensive monitor wafers since they would not be used when applying the method of the present invention.

The apparatuses and methods of the present invention are well suited for use in determining the epitaxial layer thickness and the transition width of a silicon wafer. They may also be used to determine dopant diffusion from a substrate into an active device region during a device fabrication process. Furthermore, they may be used to detect dopant contamination in a crystal growing process. Finally, they may be used to determine the extent of doping redistribution during an epitaxial deposition process.

During the use of the present invention, a single crystal silicon wafer having an isotopically enriched doped substrate and an epitaxial layer with a different isotope ratio is provided and a dopant isotope ratio analysis is performed. In a preferred embodiment, the substrate is doped with a dopant containing high purity isotopically enriched boron, and the isotope ratio analysis is performed by utilizing SIMS.

The invention is defined in its fullest scope in the appended claims and is described below in its preferred embodiments.

DESCRIPTION OF THE FIGURE

The above-mentioned and other features of this invention and the manner of obtaining them will become more apparent, and will be best understood by reference to the following description, taken in conjunction with the accompanying drawing. The drawing depicts only a typical embodiment of the invention and does not, therefore, limit its scope. It serves to add specificity and detail, in which.

DETAILED DESCRIPTION OF THE INVENTION

Figure 1:
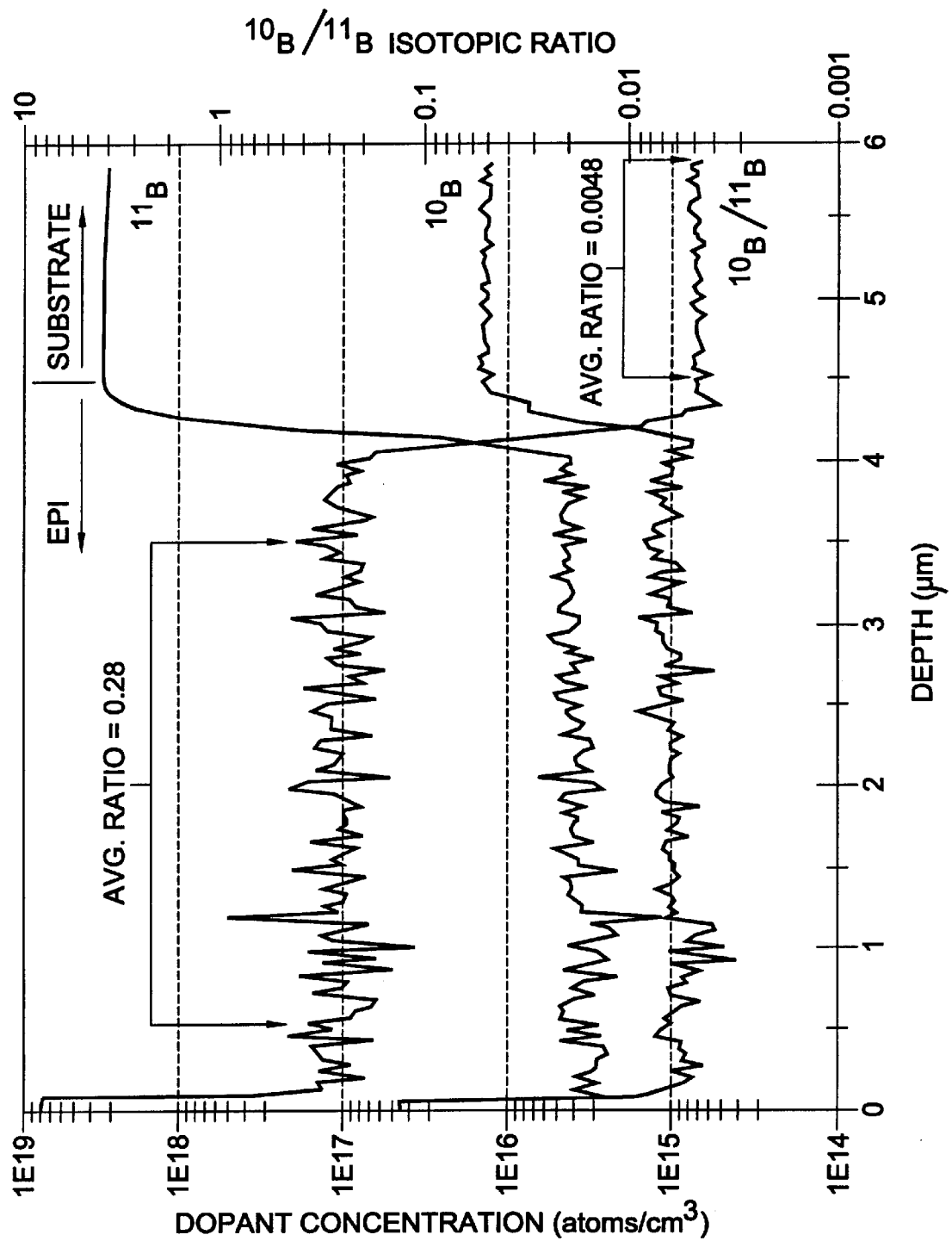
FIG. 1 is an illustrative plotted diagram showing a Secondary Ion Mass Spectrometry (SIMS) boron isotopic ratio analysis, in methods according to the invention.

The present invention provides an apparatus for and a method of determining the epitaxial layer thickness and transition width. The apparatus in accordance with the present invention provides an epitaxial single crystal silicon wafer comprising an isotopically enriched doped substrate. The method in accordance with the present invention provides a process applying Second Ion Mass Spectrometry (SIMS) to the isotopically enriched doped wafer for determining its epitaxial layer thickness and transition width.

In $P/P^+$ or $N/N^+$ type of wafer structures, where a lightly doped silicon is deposited on heavily isotopically enriched doped Czochralski (Cz) substrate wafers, due to the typically high levels ($10^{17}$ cm$^{-2}$ to $10^{18}$ cm$^{-2}$) of dopant concentration in the substrate and the high processing temperatures of approximately 1000° C. and above during epitaxial deposition, there is always some redistribution of the substrate dopant into the lightly doped (approximately $10^{15}$ cm$^{-2}$) epitaxial layer due to diffusion and autodoping. This redistribution will cause a transition region formation at the interface of the substrate and the epitaxial layer. As mentioned before, transitions of layers with similar doping concentrations, such as P-/P- or N-/N- structures, for example, are impossible to measure with conventional methods.

It is a discovery of the present invention that if a single crystal silicon ingot is grown with an enriched dopant and the epitaxial layer with a dopant of natural isotopic abundance, an analysis such as Secondary Ion Mass Spectrometry (SIMS) could be used to determine the dopant isotope ratio or isotope dilution. Such ratio analysis would enable an exact depth profile determination of the layer all the way through to the substrate. Moreover, the measurement could also be used to determine the transition width at the layer-substrate interface.

Therefore, one aspect of the present invention provides an epitaxial single crystal silicon wafer used in the microelectronic industry. The novel and unique characteristics of an epitaxial wafer according to the present invention are that its substrate is isotopically enriched doped. In a preferred embodiment, the isotopically enriched doping is realized by using a high purity isotopically enriched boron as a dopant for single crystal silicon ingot growing. Boron is an isotopically enriched boron if it contains a ratio of $^{10}B/^{11}B$ different than the naturally occurring ratio. This yields an isotopically enriched doped silicon ingot which is then used for fabricating the substrate. The isotopically enriched substrate is fabricated from the ingot by a series of well-known steps including grinding, separating (cutting), lapping, etching, polishing and cleaning. It should be recognized that other isotopically enriched dopants may also be used without departing from the spirit of the present invention.

After the isotopically enriched doped substrate is fabricated, an epitaxial layer is deposited thereon by a suitable process in an epitaxial reactor. For example, a Chemical Vapor Deposition (CVD) process may be utilized to deposit the epitaxial layer, where trichlorosilane ($HSiCl_3$) may be used as the silicon source, and diborane ($B_2H_6$) may be used as the dopant source, to achieve the desired resistivity. Diborane contains boron at the natural isotopic abundance (19.78% $^{10}B$, 80.22% $^{11}B$) unless the Diborane is produced from an enriched boron source.

Due to the difference in dopant densities in the substrate and the epitaxial layer, a transition region is formed at the interface between the substrate and the epitaxial layer. The specifications of epitaxial single crystal silicon wafers often include the acceptable thickness of the epitaxial layer and the width of the transition region. With the isotopically enriched doped wafers made in accordance with the present invention, the epitaxial layer thickness and transition width can be measured, for example, by utilizing Secondary Ion Mass Spectrometry (SIMS).

The Secondary Ion Mass Spectrometry (SIMS) technique is well known in the industry (See, for example, "Secondary Ion Mass Spectrometry", Benninghoven, Rudenhauer & Werner, John Wiley & Sons; ISBN 0-471-01056-1). As used herein "Secondary Ion Mass Spectrometry" refers to the technique described in that publication. Briefly, the technique is based on the fact that charged atomic and molecular species are ejected from the surface of a condensed phase under heavy particle bombardment. The ion-bombardment-induced emission processes include electron and photon emission and the emission of surface particles in a charged or uncharged and possibly excited state (secondary ions). These secondary ions are mass separated by mass analyzers.

The secondary ion emission is a powerful tool for the analysis of the surface and near surface depth of solid materials. The spectrum of the secondary ions emitted from the bombarded surface provides direct information on the chemical composition of the bombarded areas. Detection can be aimed at atomic ions, such as $Al^+$, $Al^{2+}$, etc.; molecular ions, such as $AlOH^+$, $Al_2OH^+$, etc.; ions of electropositive elements, such as $Na^+$, $K^+$, etc. in the positive ion spectrum; and electronegative ions such as $O^-$, $O_2^-$, $AlO^-$, $Cl^-$, etc. in the negative ion spectrum. For example, typical elements analyzed in silicon are H, Li, Be, B, C, N, O, P, S, Cl, Cu, As and Au.

One known application of the SIMS technique is to determine the dopant isotope ratio or isotope dilution. This technique is fully described in a section entitled "Isotope Dilution Mass Spectrometry" which appears at pages 301–367 of "Inorganic Mass Spectrometry", John Wiley & Sons. Briefly, this technique allows one to perform an in depth measurement of a dopant isotope concentration, and then calculate the ratio of the dopant isotope at various depths to provide depth profiles of the isotopic ratio with adequate depth resolution and ratio precision.

According to the present invention, available SIMS instruments can hold a whole wafer and save the step of sample preparation. For example, a high sputtering rate ion gun which is able to probe at a depth rate of 3 nm/s would be able to probe through a 4 µm thick epitaxial layer in about 22 minutes. It may also be adjusted to the nanometer range by varying the sputtering rate electronically. Ion mixing phenomena which occur during sample bombardment to bore into the specimen can redistribute analyte elements as a function of depth, thereby limiting the ultimate resolution of the measurement technique from the mn to µm range. Therefore, the present invention which utilizes SIMS technology can provide a rapid analysis on depth profiles of the isotopic ratio.

Referring to FIG. 1, which is an illustrative plotted diagram showing the SIMS boron isotopic ratio analysis, SIMS is utilized to first measure the dopant concentration (atoms/cm$^3$), and then to calculate the dopant isotope ratio. From the dopant isotope ratio, the depth profile of the epitaxial layer and the transition region can be determined. In this particular example, it can be seen that from the surface (0 μm) to approximately 4 μm in depth, the dopant concentration for $^{11}$B is in the range between $10^{15}$ and $10^{16}$ atoms/cm$^3$, and the dopant concentration for $^{10}$B is about $10^{15}$ atoms/cm$^3$, which results in an average dopant isotopic ratio ($^{10}$B/$^{11}$B) of 0.28. However, beyond the depth of approximately 4.5 μm, the dopant concentration for $^{11}$B jumps to above $10^{18}$ atoms/cm$^3$, while the dopant concentration for $^{10}$B only rises to above $10^{16}$ atoms/cm$^3$, which results in an average dopant isotopic ratio ($^{10}$B/$^{11}$B) of 0.0048. From this isotope ratio analysis it can be determined that in this particular wafer, the epitaxial layer thickness is approximately 4.5 μm, wherein the transition width is approximately 0.5 μm.

Therefore, another aspect of the present invention provides a method for measuring dopant distributions in a silicon wafer. The method comprises the steps of providing a single crystal silicon wafer having an isotopically enriched doped substrate and performing a dopant isotope ratio analysis. In a preferred embodiment, the substrate is doped with a dopant containing high purity isotopically enriched boron. The dopant isotope ratio analysis is performed by utilizing SIMS.

In a preferred embodiment, a method utilizing an isotopically enriched epitaxial wafer in accordance with the present invention is used for measuring the epitaxial layer thickness and transition width by SIMS. The method comprises the steps of providing a single crystal silicon wafer having a natural isotopic doped epitaxial layer deposited on an isotopically enriched doped substrate, and applying SIMS isotope ratio analysis to determine the epitaxial layer thickness and transition width. The SIMS isotope ratio analysis further includes the step of measuring respective dopant concentrations of the isotopically enriched dopant as well as the natural isotopic dopant at various depths from the surface of the wafer, and the step of calculating the resultant isotopic ratio of the isotopically enriched dopant and the natural isotopic dopant at various depths. From such calculations, the epitaxial layer thickness and transition width of the epitaxial wafer can be determined.

The method of the present invention is particularly useful for epitaxial single crystal silicon wafers where the dopant concentration of the substrate is similar to, or not significantly different from, the dopant concentration of the epitaxial layer. This is often the case in the P$^-$/P$^-$ or N$^-$/N$^-$ types of wafer structures, where the conventional methods used for determining the epitaxial layer thickness and transition width are not applicable. In general, the conventional methods are designed to measure the changes in doping concentrations or the conductivity type of the dopants. Therefore, these methods may not be applicable when the changes in doping concentrations or the conductivity type of the dopants are too small. On the other hand, the methods of the present invention are independent of the doping level of the wafers. Since the measured parameter is a ratio of the atomic isotopes, any distortion of the transition width plot in case of large differences in the substrate versus epitaxial doping densities can be minimized by controlling the isotope ratio in the substrate.

However, the application for the method of the present invention is not limited to the determination of epitaxial layer thickness and transition width in epitaxial wafers having similar dopant concentrations. It can also be applied to epitaxial wafers having significantly different dopant concentrations, such as in the cases of the P/P$^+$ or N/N$^+$ types of wafer structures, where a lightly doped silicon is deposited on heavily isotopically enriched doped Czochralski (Cz) substrate wafers.

In addition, modern dynamic SIMS instrumentation is able to provide depth profiles of the isotopic ratio with adequate depth resolution and ratio precision, to enable calculation of the transition width even on very thin epitaxial layers where the conventional capacitance-voltage (C-V) method may be inapplicable. For example, the methods of the present invention are applicable for very thin epitaxial films below 1 μm.

In another preferred embodiment, a method utilizing isotopically enriched doped wafers in accordance with the present invention is applied in a device fabrication process. Dynamic SIMS analysis enables the determination of dopant diffusion from the substrate into active device regions which may be doped with N or P type dopants after extensive thermal cycling at high temperatures (above 1100° C.). The usefulness of this method is the ability to diagnose problems with device design and process contamination.

In a preferred embodiment, the method for determining dopant diffusion from a substrate into an active device region comprises the steps of providing an isotopically enriched doped substrate, fabricating a device on the substrate, and performing a dopant ratio analysis. Preferably, the substrate is doped with a dopant containing high purity isotopically enriched boron, and the dopant ratio analysis is performed by SIMS.

Another application of the present invention is the detection of process contamination by analyzing the isotope dilution. Theoretically, if there is no external source of dopant contamination in a crystal growing process, the ingots would have the isotope ratio of the original dopant. However, if there are any sources of contamination, such as contaminated quartz crucibles or polysilicon raw material, the isotope ratio in the final crystal will change because the contaminating sources of dopant concentration would be at the natural abundance. Since isotope ratios can be measured with very high precision by applying Thermal Ionization Mass Spectrometry (TIMS) to the isotopically enriched doped wafers of the present invention, even small sources of contamination can be identified.

Therefore, in a preferred embodiment, a method utilizing isotopically enriched doped wafers in accordance with the present invention is used to detect dopant contamination in a crystal growing process. The method comprises the steps of growing an isotopically enriched doped silicon ingot and measuring the isotopic ratio of the silicon ingot. Preferably, the substrate is doped with a dopant containing high purity isotopically enriched boron, and the dopant ratio analysis is performed by TIMS.

TIMS is a technique which is well known and used in the industry. Briefly, when molecular or atomic ions are produced at a hot surface of a metal filament, thermal ionization occurs. This technique employs an ion source with single, double or triple filament arrangements for the evaporation and the ionization process. Using a single filament ion source, the evaporation and ionization process of the substance to be determined are carried out on the same filament source. Double or triple filament ion sources use double or two filaments for the evaporation of the compound and the gaseous sample molecule or atom is adsorbed on the surface of the other filament. After an electron transfer occurs from the molecule to the filament (production of positive ions) or by inverse effect (negative ions), the ion can be de-absorbed from the filament surface and be measured. A more detailed description of the TIMS technique may be found in U.S. Pat. No. 4,647,772, the relevant content of which is incorporated herein by reference.

A further application of the present invention is in determining the extent of doping redistribution in certain situations. For example, in the case of large differences in substrate versus epitaxial doping densities, the methods of the present invention allow one to determine the extent of doping redistribution from said substrate into the epitaxial layer, since the epitaxial layer should contain a natural isotope ratio.

The foregoing is meant to illustrate, but not to limit, the scope of the invention. Indeed, those of ordinary skill in the art can readily envision and produce further embodiments, based on the teachings herein, without undue experimentation.

The present invention may be embodied in other specific forms without departing from its essential characteristics. The described embodiment is to be considered in all respects only as illustrative and not as restrictive. The scope of the invention is, therefore, indicated by the appended claims rather than by the foregoing description. All changes which come within the meaning and range of the equivalence of the claims are to be embraced within their scope.

What is claimed is:

1. A single crystal silicon wafer comprising a substrate doped with two isotopes of a dopant according to a first predetermined ratio; and an epitaxial layer formed on said substrate and doped with two isotopes of the dopant according to a second predetermined ratio, wherein the first and second predetermined ratios are different such that said epitaxial layer can be distinguished from said substrate based upon the difference in isotopic ratios.

2. The single crystal silicon wafer as defined in claim 1, wherein said substrate is doped with a high purity isotopically enriched dopant.

3. The single crystal silicon wafer as defined in claim 1, wherein said epitaxial layer is doped with a dopant of natural isotopic abundance.

4. The single crystal silicon wafer as defined in claim 1 wherein said substrate is doped with a dopant containing high purity isotopically enriched boron and wherein said epitaxial layer is doped with a dopant containing natural isotopic boron.

5. A single crystal silicon wafer as defined in claim 1 wherein said substrate and said epitaxial layer are each doped with a substantially equal concentration of the same dopant such that said substrate and said epitaxial have substantially equal specific resistivities.

6. The single crystal silicon wafer as defined in claim 4 wherein said substrate and said epitaxial layer are each doped with a substantially equal concentration of boron such that said substrate and said epitaxial layer have substantially equal specific resistivities.

7. The single crystal silicon wafer as defined in claim 4 wherein a transition region is defined between said substrate and said epitaxial layer, and wherein the different isotopic ratios of said substrate of said epitaxial layer permit the epitaxial layer thickness and the transition region thickness to be determined with Secondary Ion Mass Spectrometry (SIMS).

8. The single crystal silicon wafer as defined in claim 5 wherein a transition region is defined between said substrate and said epitaxial layer, and wherein the different isotopic ratios of said substrate and said epitaxial layer permit the epitaxial layer thickness and transition region width to be determined.

9. A method for analyzing a silicon wafer comprising the steps of:

a. providing a single crystal silicon wafer having a substrate doped with two isotopes of a dopant analyzing the single crystal silicon wafer based upon the different isotope ratios which distinguish the substrate and the epitaxial layer.

10. The method as defined in claim 9, wherein said providing step comprises a step of doping said substrate with a high purity isotopically enriched dopant.

11. The method as defined in claim 9, wherein said analyzing step comprises performing Secondary Ion Mass Spectrometry (SIMS).

12. The method as defined in claim 9, wherein said providing step comprises a step of forming an epitaxial layer on said substrate that is doped with a dopant of natural isotopic abundance.

13. The method as defined in claim 9 wherein said providing step comprises the steps of doping said epitaxial layer with a dopant containing a natural isotopic boron, and doping the substrate with a dopant containing high purity isotopically enriched boron.

14. The method as defined in claim 13, wherein said substrate and said epitaxial layer are each doped with a substantially equal concentration of boron such that said substrate and said epitaxial layer have substantially equal specific resistivities, and wherein said analyzing step comprises a step of performing Secondary Ion Mass Spectrometry (SIMS) to determine a dopant isotopic ratio at various depths from the surface of said wafer.

15. The method as defined in claim 9, wherein said silicon wafer has a transition region between the epitaxial layer and the substrate, and wherein said analyzing step comprises a step of calculating a dopant isotopic ratio at various depths from the surface of said wafer such that the thickness of the epitaxial layer and the width of the transition region of the silicon wafer can be determined.

16. The method as defined in claim 15, wherein said calculating step comprises performing Secondary Ion Mass Spectrometry (SIMS).

* * * * *

UNITED STATES PATENT AND TRADEMARK OFFICE
CERTIFICATE OF CORRECTION

PATENT NO. : 5,891,242
DATED : April 6, 1999
INVENTOR(S) : Pesklak et al.

It is certified that error appears in the above-indentified patent and that said Letters Patent is hereby corrected as shown below:

Title page:

Item [56], in the References Cited, U.S. PATENT DOCUMENTS, line 1, "Etal" should read --Cowlard et al.--;

line 4, "Liu" should read --Liu et al.--.

Item [57], in the Abstract, line 6, "Second" should read --Secondary--.

Column 7, line 50, after "epitaxial" insert --layer--.

Column 8, line 17, after "dopant" insert --according to a first predetermined ratio, and an epitaxial layer formed on the substrate and doped with two isotopes of the dopant according to a second predetermined ratio, wherein the first and second predetermined ratios are different; and
      b. [performing a dopant isotope ratio analysis of] analyzing the single crystal silicon wafer based upon the different isotope ratios which distinguish the substrate and the epitaxial layer--.

Signed and Sealed this

Twenty-eighth Day of September, 1999

Attest:

Q. TODD DICKINSON

*Attesting Officer*  *Acting Commissioner of Patents and Trademarks*